United States Patent
Lai et al.

(10) Patent No.: US 6,484,286 B1
(45) Date of Patent: Nov. 19, 2002

(54) ERROR SIGNAL CALCULATION FROM A VITERBI OUTPUT

(75) Inventors: Paul Lai, San Jose, CA (US); Shirish Altekar, Los Gatos, CA (US); Kwok Wah Yeung, Milpitas, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/388,037

(22) Filed: Sep. 1, 1999

(51) Int. Cl.$^7$ ................................................ G06F 11/00
(52) U.S. Cl. ........................................ 714/795; 714/799
(58) Field of Search ................................. 714/795, 799; 375/265

(56) References Cited

U.S. PATENT DOCUMENTS

| | | | |
|---|---|---|---|
| 5,844,741 A | * | 12/1998 | Yamakawa et al. |
| 5,896,067 A | * | 4/1999 | Williams |
| 6,043,946 A | * | 3/2000 | Genheimer et al. |
| 6,154,504 A | * | 11/2000 | Ino |
| 6,252,731 B1 | * | 6/2001 | Sloan et al. |

OTHER PUBLICATIONS

Cideciyan, Roy D.; Dolivo, Francois; Hermann, Reto; Hirt, Walter, "A PRML System for Digital Magnetic Recording", Jan. 1, 1992, IEEE Journal on Selected Areas in Communications.

* cited by examiner

Primary Examiner—Phung M. Chung
(74) Attorney, Agent, or Firm—Lathrop & Gage, L.C.

(57) ABSTRACT

Structure and methods for reduced latency in calculating an error signal based on the output of a Viterbi detector. Certain partial terms of the error signal are precomputed before the final output of the Viterbi detector is determined. The precomputed terms are used to determine the error in fewer clock cycles once the Viterbi output is fully determined. In one exemplary embodiment, the final Viterbi output is used as an input to a multiplexer that selects a precomputed error. In addition to calculating an error signal, a level signal may be precomputed as well so that the level signal is available more quickly after the output of the Viterbi detector is fully determined.

16 Claims, 5 Drawing Sheets

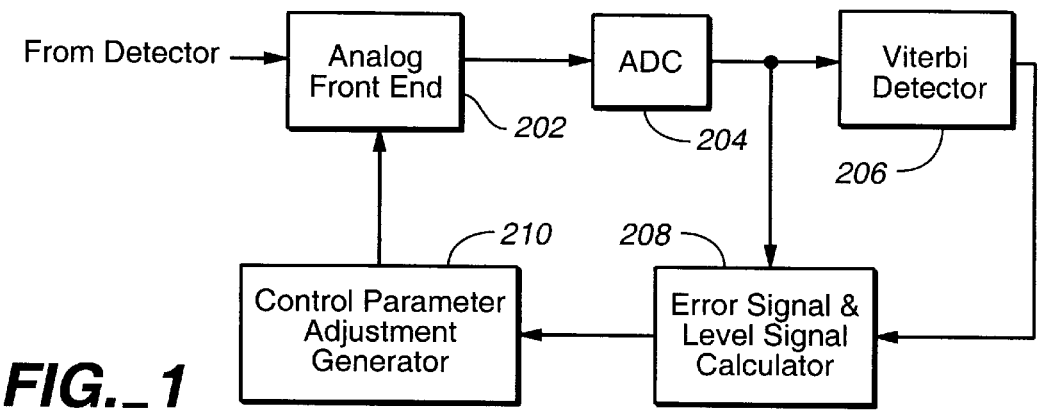
FIG._1
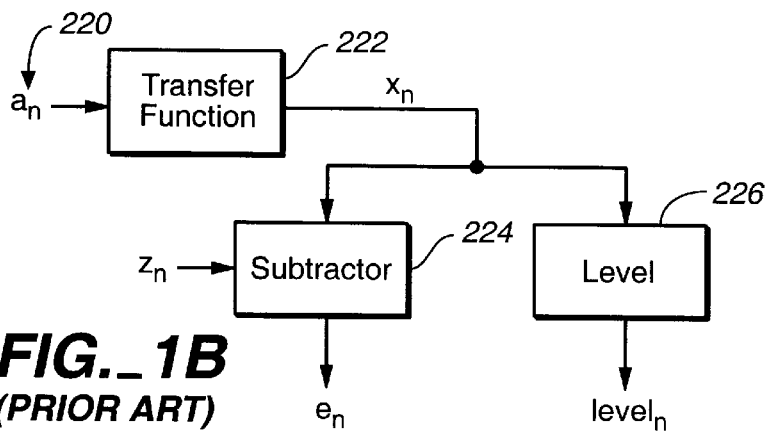
FIG._1B
(PRIOR ART)
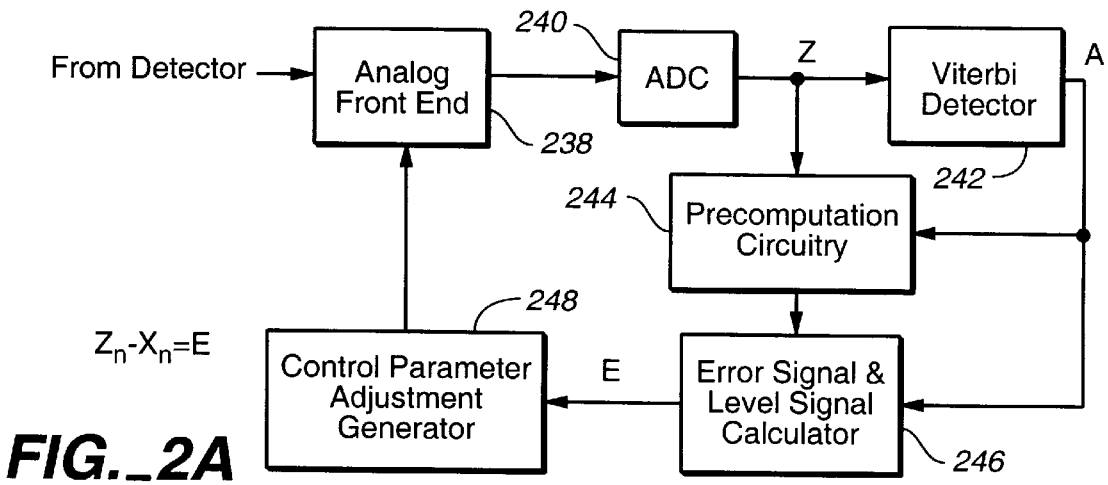
$Z_n - X_n = E$
FIG._2A

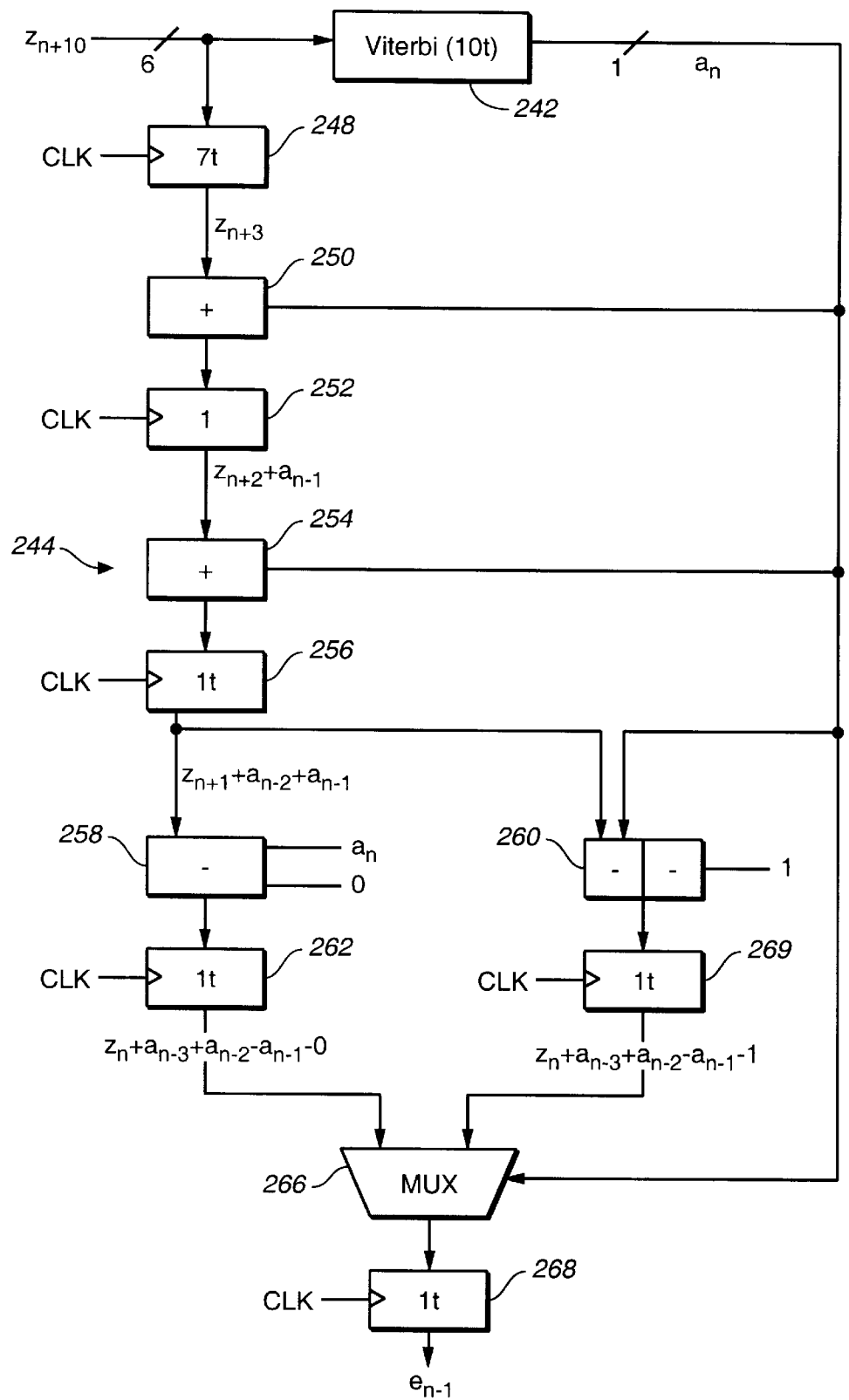
FIG._2B

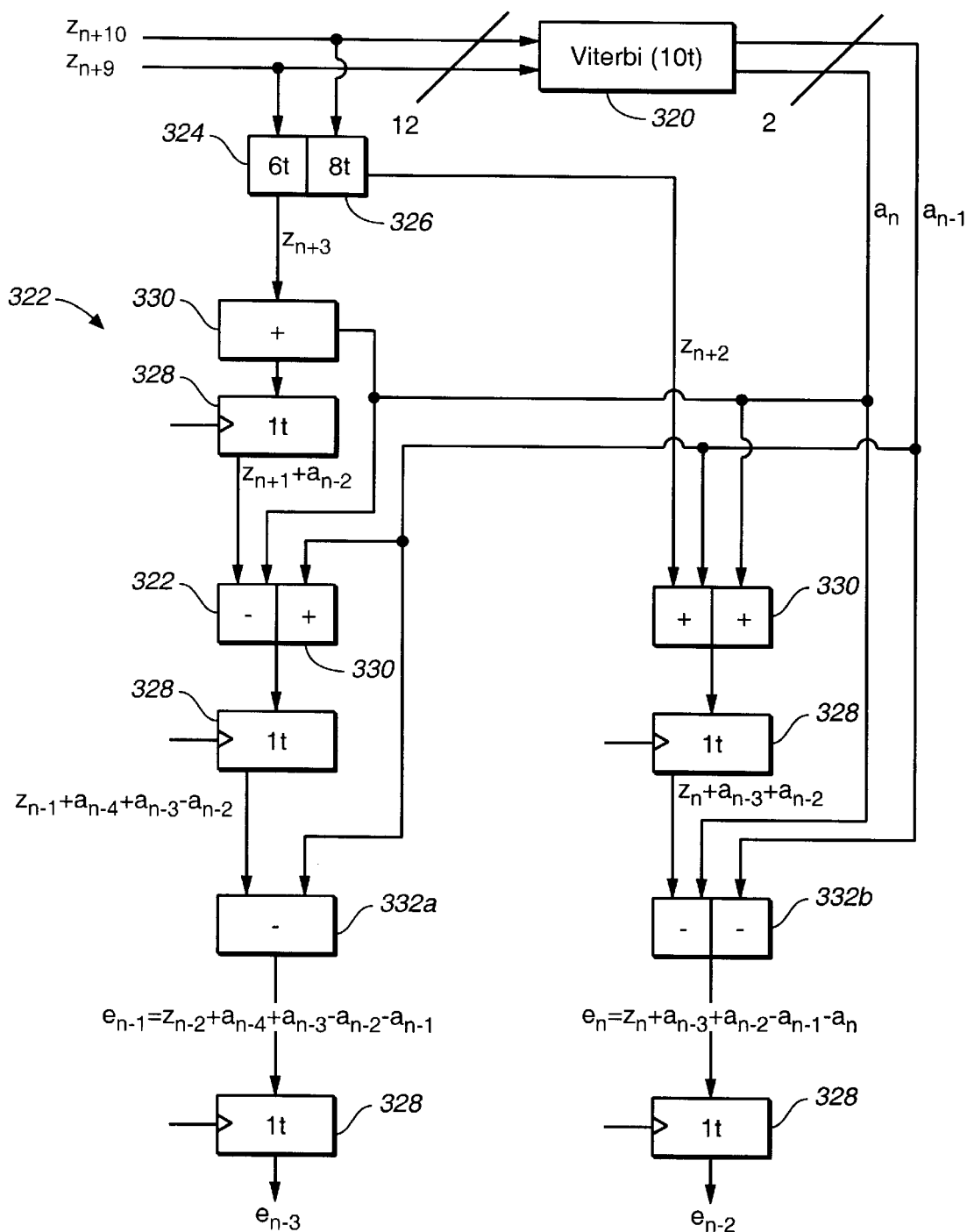
FIG._3A

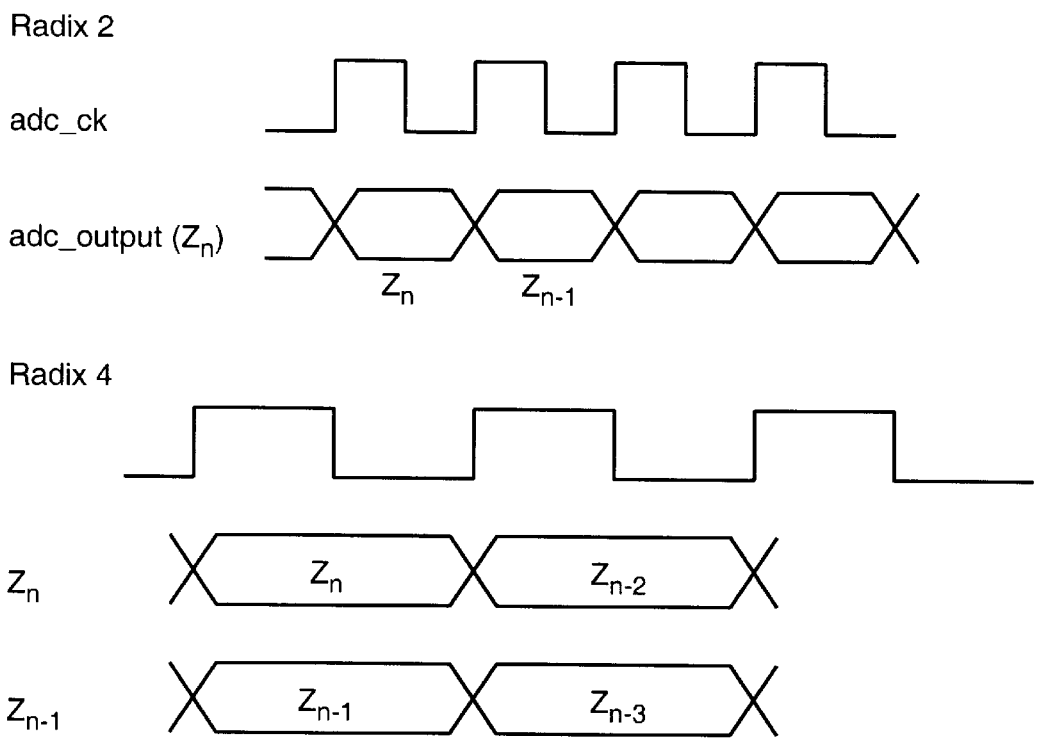
FIG._3B
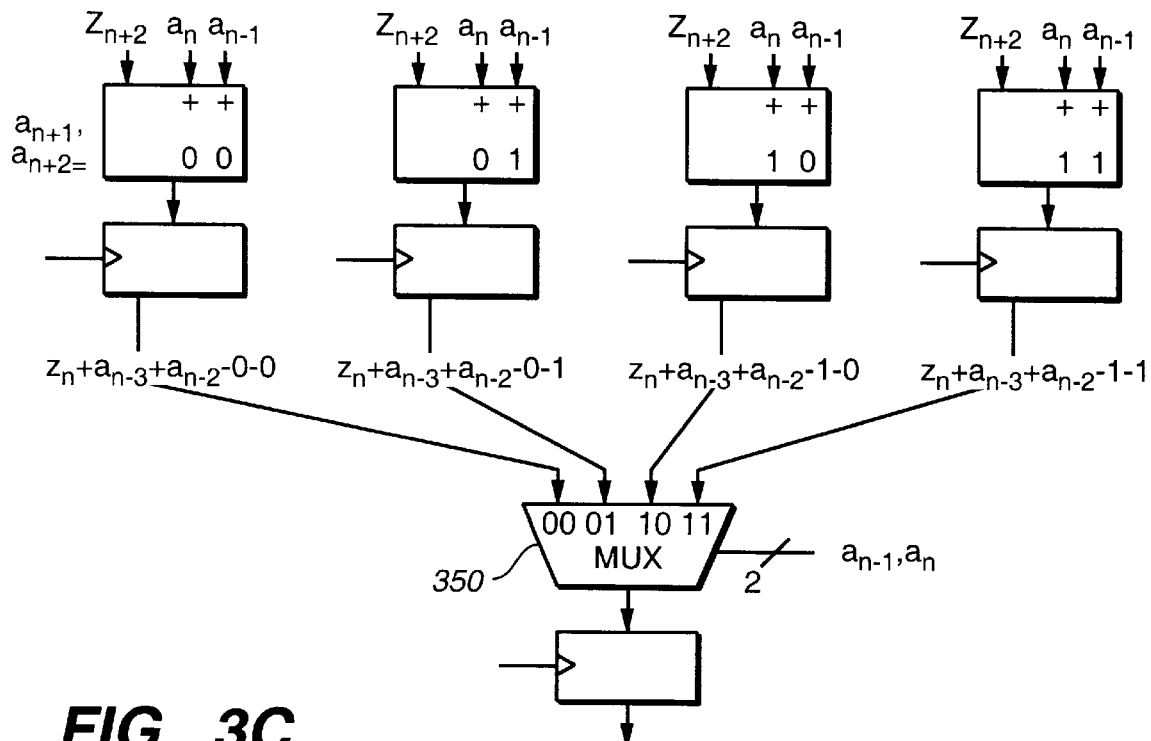
FIG._3C

Truth Table (transfer function = $1 + D - D^2 - D^3$)
(01 = positive; 11 = negative; 00 = zero)

| $a_n$ | $a_{n-1}$ | $a_{n-2}$ | $a_{n-3}$ | level($x_n$) |
|---|---|---|---|---|
| 0 | 0 | 0 | 0 | 00 |
| 1 | 0 | 0 | 0 | 01 |
| 0 | 1 | 0 | 0 | 01 |
| 1 | 1 | 0 | 0 | 01 |
| 0 | 0 | 1 | 0 | 11 |
| 1 | 0 | 1 | 0 | 00 |
| 0 | 1 | 1 | 0 | 00 |
| 1 | 1 | 1 | 0 | 01 |
| 0 | 0 | 0 | 1 | 11 |
| 1 | 0 | 0 | 1 | 00 |
| 0 | 1 | 0 | 1 | 00 |
| 1 | 1 | 0 | 1 | 01 |
| 0 | 0 | 1 | 1 | 11 |
| 1 | 0 | 1 | 1 | 11 |
| 0 | 1 | 1 | 1 | 11 |
| 1 | 1 | 1 | 1 | 00 |

FIG._4

ERROR SIGNAL CALCULATION FROM A VITERBI OUTPUT

FIELD OF THE INVENTION

The present invention relates generally to error detection in a read channel. More specifically, a system and method for precomputing an error signal from a Viterbi output is disclosed.

BACKGROUND OF THE INVENTION

FIG. 1A is a block diagram of a magnetic disk reading system including circuitry for reading an analog signal from a magnetic storage disk. An analog signal is recovered from a detector and input to analog front end 202. Analog front end 202 includes various analog processing components that condition the signal from the detector for deriving a digital signal from the analog data. For example, analog front end 202 may include a boost filter for boosting the high frequency component of the signal from the detector. Analog front end 202 may also include an adjustable gain amplifier that amplifies the signal. In addition, analog front end 202 may include an adjustable timing loop that recovers a clock from the signal or adjusts a clock to be synchronized to the analog data signal read from the detector. Analog front end 202 may also include an adaptive equalizer for equalizing the analog signal.

Some or all of the above-mentioned analog components may be adaptable based on the signal that is being read. Different disk drive systems tend to have different channel transfer functions or responses when data is read from disk. In fact, a single disk or disk drive may change as the disk or disk drive ages and experiences wear. As a result, it is often necessary to adjust the parameters of the devices in the analog front end such as the boost filter, the gain, the amplifier, the timing recovery circuit, and the equalizer to adapt to changes in the disk. Also, these various components may need to be adapted to vary for changes that occur in reading different regions of a single disk.

The output from analog front end 202 is input to an analog-to-digital converter (ADC) 204. The output of analog-to-digital converter 204 in one embodiment is a six-bit output that forms part of a sequence, Z: $z_1, z_2, \ldots z_n, z_{n+1}\ldots$, Z is the data sequence that results from the data that was originally written to the disk being transformed by the data channel. The six-bit representation of the elements of the input sequence at the output has more precision than the input data itself because it has been transformed by intersymbol interference and other effects of the channel.

The digitized output of ADC 204 is input to a Viterbi detector 206. Viterbi detector 206 is configured to read the six-bit output from the analog-to-digital converter and to determine, based on the sequence of data, the most likely input sequence that produced the sequence. The Viterbi detector may do that by determining the Euclidean distance from a given output sequence to different possible output sequences that correspond to various input sequences. The possible output sequence that is the closest to the detected output sequence is determined to be the correct output sequence. In doing this, the Viterbi detector must look at more than one element of the output sequence of the analog-to-digital converter because the transfer function of the channel and analog front end 202 is generally a function of more than one element in the data sequence. For example, one type of coding, EPR4, has a transfer function that is $1+D-D^2-D^3$. Thus, Viterbi detector 206 operates on the raw digitized output from the ADC to produce a recovered data sequence corresponding to a most likely input sequence.

The performance of components in analog front end 202, such as the equalizer and the timing recovery circuit, can be improved by adapting their characteristics using feedback from the output. To that end, an error signal that describes the difference between the raw digitized output and the recovered data signal is computed. Accordingly, the output of Viterbi detector 206 is sent to error signal calculation circuitry 208. Error signal calculation circuitry 208 computes an error signal by subtracting the transformed output of Viterbi detector 206 from the corresponding output of ADC 204. In addition, error signal calculation circuitry 208 may calculate other parameters such as a level signal. A level signal indicates whether an output is positive, negative, or zero and can be used in conjunction with the error signal to improve the performance of components in analog front end 202.

The output of error signal calculation circuitry 208 is sent to a control parameter adjustment generator 210. Control parameter adjustment generator 210 uses the signals calculated by error signal calculation circuitry 208 to compute parameters that can be used to improve the performance of, for example, the timing loop, the gain loop, the offset loop, the MR amplitude asymmetry loop, and the filter boost loop in analog front end 202.

FIG. 1B is a block diagram of an implementation of error signal calculation circuitry 208. A recovered output signal 220, $a_n$, is received from Viterbi detector 206 and sent to circuitry 222 that applies a transfer function to the recovered output signal.

The transfer function applied by circuitry 222 typically relies on multiple terms in the sequence, A, of recovered output signals, $a_1, a_2, \ldots a_n, a_{n+1}\ldots$. Thus, circuitry 222 typically includes memory elements for storing a plurality of recovered output signals, $a_{n-1}, a_{n-2}, a_{n-3}$, from Viterbi detector 206, and also includes a processor or logic for applying a transfer function to the sequence of recovered output signals.

Circuitry 222 operates on a sequence of recovered output signals, $a_n, a_{n-1}, a_{n-2}, a_{n-3}$, to produce a transformed signal, $x_n$. This transformed signal, $x_n$, is used to compute an error signal, $e_n$, and a level signal, $level_n$. The error signal, $e_n$, is computed by subtracting the transformed output signal, $x_n$, from the raw digitized output signal, $z_n$, (224) where $z_n$ represents the output signal corresponding to the recovered data signal, $a_n$, from which the transformed signal, $x_n$, was calculated. The level signal is calculated from the transformed output, $x_n$, and simply indicates whether $x_n$ is positive, negative, or zero (226).

Because circuitry 222 uses a sequence of recovered output signals to calculate $X_n$ —— for example, the EPR4 transfer function uses $a_n, a_{n-1}, a_{n-2},$ and $a_{n-3}$—there is a delay of several clock cycles while circuitry 222 waits to receive this sequence. Moreover, because the calculation of $x_n$ is relatively complex—requiring several multi-bit additions and subtractions—it typically requires multiple clock cycles to complete, even after the sequence of recovered output signals, $a_n, a_{n-1}, a_{n-2}, a_{n-3}$, has been received.

Thus, to compute an error signal, $e_n$, circuitry 222 first waits several clock cycles to collect the sequence of recovered output signals, $a_n$, necessary to calculate $x_n$. This is followed by additional delay while the transfer function is applied to yield $x_n$. And finally, additional delay occurs when $x_n$ is subtracted from the raw digitized output signal $z_n$ to yield $e_n$.

Thus, while the above-described system is effective for disk reading schemes that utilize a simple read-channel target transfer function such as PRML or EPRML, it begins to lose its effectiveness as the complexity of the target transfer function increases, and each element of the read channel output sequence becomes a function of a greater number of input sequence elements. Computing the error from the input to the output in the manner described above for a system with a more complex transfer function, such as EPR4, requires the recovery of several output data points before the error can determined. This increases the latency of the system and reduces the effectiveness of the feedback loop.

Accordingly, a better method of calculating the error is needed to decrease the delay in the feedback loop and to increase the effectiveness of various adaptive elements in the read channel.

SUMMARY OF THE INVENTION

A reduced latency method of calculating an error signal based on the output of a Viterbi detector is disclosed. Certain terms of the error signal are precomputed before the final output of the Viterbi detector is determined. The precomputed terms are used to determine the error in fewer clock cycles once the Viterbi output is determined. In one embodiment, the final Viterbi output is used as an input to a multiplexer that selects a precomputed error. In addition to calculating an error signal, a level signal may be precomputed as well so that the level signal is available more quickly after the output of the Viterbi detector is determined.

In one embodiment, a system for determining an error signal from an output of a Viterbi detector includes an analog-to-digital converter for converting a raw output from a data channel into a raw digitized output. A Viterbi detector determines a recovered data sequence from the raw digitized output. An error signal preprocessor is operable to compute a partial error signal from a first portion of the recovered data sequence and the raw digitized output. An error signal processor is operable to compute a final error signal from the partial error signal and a second portion of the recovered data sequence.

In one embodiment, a method of determining one or more signals includes receiving a raw digitized output from a data channel. A first portion of a recovered data sequence determined from the raw digitized output is received. A partial error signal is precomputed from the first portion of the recovered data sequence and the raw digitized output. A second portion of a recovered data sequence determined from the raw digitized output is received. A final error signal is computed from the partial error signal and a second portion of the recovered data sequence.

In one embodiment, a method of determining a level signal includes receiving a recovered data sequence determined from the raw digitized output by a Viterbi detector. A partial level signal is precomputed from a first portion of the recovered data sequence and the raw digitized output. A final level signal is computed from the partial level signal and a second portion of the recovered data sequence.

BRIEF DESCRIPTION OF THE DRAWINGS

The present invention will be readily understood by the following detailed description in conjunction with the accompanying drawings, wherein like reference numerals designate like structural elements, and in which:

FIG. 1A is a block diagram of a magnetic disk reading system including circuitry for reading an analog signal from a magnetic storage disk.

FIG. 1B is a block diagram of a prior art implementation of error signal calculation circuitry for use in conjunction with a magnetic disk reading system.

FIG. 2A is a block diagram illustrating a system for practicing an embodiment of the present invention.

FIG. 2B is a more detailed illustration of a system for precomputing an error signal according to one embodiment of the present invention.

FIG. 3A is an illustration of a system for precomputing error signals in a radix-four embodiment of the present invention.

FIG. 3B is an illustration of a clocking scheme used in radix 2 and radix 4 embodiments of the present invention.

FIG. 3C is an illustration of a multiplexer.

FIG. 4 is an illustration of a truth table for a level signal in accordance with one embodiment of the present invention.

DETAILED DESCRIPTION

A detailed description of the invention is provided below. While the invention is described in conjunction with several embodiments, it should be understood that the invention is not limited to any one embodiment. On the contrary, the scope of the invention is limited only by the appended claims, and the invention encompasses numerous alternatives, modifications, and equivalents. For example, while the description appearing below is in the context of a system for computing error and level signals for use by a magnetic disk drive system, those skilled in the art will recognize that the disclosed systems and methods are readily adaptable for broader application. For example, without limitation, the systems and methods described below could be used to compute other types of signals, and could be used on devices other than magnetic storage devices.

Moreover, while numerous details are set forth in the following description in order to provide a thorough understanding of the present invention, some details relating to technical material that is known in the technical fields related to the invention have not been described in depth in order to avoid unnecessarily obscuring the present invention. It should be understood that the present invention might be practiced according to the claims without some or all of these details.

The systems and methods disclosed herein compute an error signal for use in a feedback loop. As described above, prior art systems read a signal from a magnetic medium and pass this signal to an analog-to-digital converter (ADC) which yields a multi-bit raw digitized output signal. This signal is fed to a Viterbi detector which recovers a sequence of single-bit outputs. A transfer function is applied to the output of the Viterbi detector, and the resulting signal is combined with a corresponding output from the ADC to yield an error signal that can be used in a system feedback loop. Because the transfer function used to compute such an error signal is typically relatively complex, the computation of the error signal may take several clock cycles to execute.

The methods and apparatuses disclosed herein take advantage of the time during which the Viterbi detector is processing a signal from the ADC to precompute certain terms of the error signal. Thus, once the Viterbi detector is finished processing the raw digitized output from the ADC, the error signal can be calculated more rapidly, since certain terms have already been computed. As a result, the latency of the error signal is reduced and the overall effectiveness of the system is improved.

In addition, the methods and apparatuses disclosed herein can compute the level signal, $level_n$, for the transformed output, $x_n$, in an efficient manner. In one embodiment, $level_n$ is calculated using combinational logic, such that it is available for use by other components of the system during the same clock cycle as the error signal. In another embodiment, $level_n$ is partially precomputed, similar to the manner in which the error signal is partially precomputed, thus decreasing the amount of time necessary to compute the signal, and also ensuring that $level_n$ is available during the same clock cycle as the error signal.

FIG. 2A is a block diagram illustrating a system for practicing an embodiment of the present invention. An analog-to-digital converter 240 receives a sequence of raw output signals from analog front end 238 and sends a sequence of digitized raw output signals, Z, to Viterbi detector 242. Viterbi detector 242 converts the sequence of digitized raw output signals, Z, into a sequence of recovered output signals, A, from which a sequence of error signals, E, are calculated. As described above, an error signal, $e_n$, is typically obtained by subtracting $x_n$ from $z_n$, where $x_n$ is a transformed output obtained by applying a transfer function to a portion of the sequence of recovered output signals, A.

Precomputation circuitry 244 is configured to receive the outputs, $a_n$, of Viterbi detector 242 and the outputs, $z_n$, of ADC 240, and to precompute a portion of error signal, $e_n$, using $z_n$ and a portion of the sequence of recovered output signals, A. As a result, when the final portion of the sequence of recovered output signals—i.e., $a_n$—is received from Viterbi detector 242, the error signal, $e_n$, can be quickly calculated by simply combining the output of precomputation circuitry 244 with $a_n$.

FIG. 2B is a more detailed illustration of error precomputation circuitry 244 according to one embodiment of the present invention. In this embodiment, the error function, $e_n$, is calculated by subtracting the transformed recovered output signal, $x_n$, from the raw-digitized output signal, $z_n$. In the embodiment shown in FIG. 2B, the EPR4 transfer function—i.e., $1+D-D^2-D^3$—is applied to the recovered output sequence $a_{n-3}$, $a_{n-2}$, $a_{n-1}$, $a_n$ to yield $e_n = z_n + a_{n-3} + a_{n-2} - a_{n-1} - a_n$.

As shown in FIG. 2B, Viterbi detector 242 has an associated delay, 10 T, corresponding to the amount of time it takes raw digitized input, $z_n$, to be processed by Viterbi detector 242 and output as a corresponding term, $a_{n+T}$, of the recovered data sequence, A. For purposes of illustration, this delay is shown in FIG. 2B as ten clock cycles. It should be noted that the systems and methods described herein can readily be applied to other length delays.

Referring to FIG. 2B, a raw digitized output signal, $z_n$, from analog-to-digital converter 240 is sent to Viterbi detector 242, and Viterbi detector 242 outputs a recovered data signal, $a_n$. Because Viterbi detector 242 has a ten-cycle delay, the output of Viterbi detector 242 at a given time corresponds to the input, $z_n$, received ten cycles earlier. Thus, in FIG. 2B the input to Viterbi detector 242 is denoted by $z_{n+10}$, while the output of Viterbi detector 242 is denoted by $a_n$.

The raw digitized output signal, $z_{n+10}$, from analog-to-digital converter 240 is also sent to precomputation circuitry 244. In the embodiment shown in FIG. 2B, this signal is first sent to a seven-cycle delay element 248. The output of delay element 248 is seven cycles later in time than the input. Thus, in FIG. 2B the input to delay element 248 is $z_{n+10}$, and the output is $z_{n+3}$.

The output, $a_n$, of Viterbi detector 242 is added to the output of delay element 248 by adder 250. The result of this addition is preferably latched into memory unit 252 for storage, and becomes available on the output of memory unit 252 on the next clock cycle. Thus, at a given time, n, the output of memory unit 252 will be $z_{n+2} + a_{n-1}$.

Similarly, the output of Viterbi detector 242 is added to the output of memory element 252 by adder 254. The result is latched into memory unit 256 similar to the manner by which the output of adder 250 was latched into memory unit 252. Thus, on the following clock cycle, the output of memory unit 256 is equal to $z_{n+1} + a_{n-2} + a_{n-1}$.

The output of memory element 256 is sent to subtractors 258 and 260, where it is combined with the current output, $a_n$, of Viterbi detector 242. In addition, each subtractor 258, 260 is preferably configured to subtract an additional bit from the result, for use later with multiplexer 266. Thus, subtractor 258 subtracts an additional 0 from the result of its subtraction, and subtractor 260 subtracts an additional 1 from the results of its subtraction. The outputs of subtractors 258 and 260 are latched into memory elements 262 and 264, respectively.

The outputs of memory elements 262, 264 are applied as inputs to 2-to-1 multiplexer 266. Thus, the input to multiplexer 266 consists of the output of memory element 262 and the output of memory element 264. The output of memory element 262 is $z_n + a_{n-3} + a_{n-2} - a_{n-1} - 0$, and the output of memory element 262 is $z_n + a_{n-3} + a_{n-2} - a_{n-1} - 1$.

When the next output, $a_n$, from Viterbi detector 242 is received, it can be used to select the appropriate input of multiplexer 266. For example, if the value of $a_n$ is 0, then the multiplexer input corresponding to the output of memory unit 262 is selected, while if the output of $a_n$ is 1, then the multiplexer input corresponding to the output of memory element 264 is selected. The input that is selected is passed through to the output of multiplexer 266, where it is latched into memory element 268.

Thus, memory element 268 contains the error signal, $e_n$, calculated by subtracting the transformed signal, $x_n$, from the raw digitized output signal, $z_n$, received from analog to-digital converter 240. That is, $e_n$ is equal to $z_n$ minus the output of the Viterbi detector multiplied by an appropriate transfer function. Thus, if the EPR4 transfer function were chosen—i.e., $1+D-D^2-D^3$—the error signal would be equal to $z_n + a_{n-3} + a_{n-2} - a_{n-1} - a_n$.

Delay element 248 can be implemented using a memory device such as a flip flop or latch in conjunction with a counter. Any suitable delay element could be used in accordance with the principles of the present invention. Similarly, subtractors 258, 260 and adders 250, 254 may be implemented using standard digital adder or subtractor circuitry or any other suitable circuitry. For example, in one embodiment, signals are represented in twos-complement form, thus enabling both addition and subtraction to be performed by standard adder circuits. Moreover, while memory elements 252, 256, 262, 264, and 268, preferably comprise flip-flop or latch circuits, such as D, T, SR, and JK flip-flops or latches, it will be appreciated that any suitable memory element could be used. Furthermore, while a Viterbi detector is used in a preferred embodiment, it will be appreciated that other suitable sequence-detectors, maximum-likelihood-sequence-detectors, or dynamic programming techniques could be used in accordance with the teachings of the present invention.

In the illustrated embodiment, the circuit shown in FIG. 2B uses a multiplexer to provide the output error signal, $e_n$. This implementation has a speed advantage. In other embodiments, another layer of adder/subtractor circuits is used instead of the multiplexer. Thus, for example, in some embodiments, subtractor 260 and memory element 264 are removed, and multiplexer 266 is replaced with an adder/subtractor circuit that subtracts the current output, $a_n$, of Viterbi detector 242 from the output of memory element 262.

In one embodiment, the output from Viterbi detector 242 is a one-bit, radix-two number. Other types of Viterbi detectors are used in other embodiments. For example, FIG. 3A illustrates an embodiment in which the output of the Viterbi detector comprises a two-bit or radix-four number. The Viterbi detector is operable to accept a twelve-bit raw digital signal, $z'_n$, and to output a two-bit recovered output signal, $a'_n$. The raw input digital signal, $z'_n$, includes two six-bit raw digital signals, $z_{n-1}$ and $z_n$ and the two-bit recovered output signal, $a'_n$, includes two, one-bit recovered output signals, $a_{n-1}$ and $a_n$. The period of the system clock is doubled, as shown in FIG. 3B.

With reference to FIG. 3A, a system is shown for pre-computing error signals in a radix-four embodiment. In this embodiment, Viterbi detector 320 reads in two digitized raw output signals, $z_{n+9}$ and $z_{n+10}$, on each clock cycle, and outputs two recovered data signals, $a_{n-1}$ and $a_n$. Precomputation circuitry 322 aids in the computation of two error signals, $e_{n-1}$ and $e_n$, where:

$$e_{n-1} = z_{n-1} + a_{n-4} + a_{n-3} - a_{n-2} - a_{n-1};$$

and $$e_n = z_n + a_{n-3} + a_{n-2} - a_{n-1} a_n$$

To precompute these error signals, a combination of delay elements 324, 326; memory elements 328; adders 330; and subtractors 332 can be connected in a manner similar to that shown in FIG. 2B for a radix-two embodiment. One such implementation is shown in FIG. 3A. Note that because two samples are read into Viterbi detector 320 on each clock cycle, a delay of one clock period effectively decrements the subscript on the elements in the input and output sequences by two units. The 10t delay of the Viterbi in this embodiment indicates the number of sample period delays, which corresponds to 5T clock periods, where t indicates sample periods and T indicates clock periods.

In the embodiment shown in FIG. 3A, subtractors 332a and 332b are used to combine the final relevant terms from Viterbi detector 320 with the precomputed portions of error signals, $e_{n-1}$ and $e_n$, thus yielding error signals $e_{n-1}$ and $e_n$, respectively. However, in an alternate embodiment, multiplexers are used instead. Specifically, in one embodiment, two 4-to-1 multiplexers are used to combine the final relevant terms, $a_{n-1}$, $a_n$, of the recovered input sequence with the precomputed partial error signals, to yield error signals $e_{n-1}$ and $e_n$. It has been found that such a multiplexer implementation can provide an increase in speed.

One such multiplexer is shown in FIG. 3C. The final two terms, $a_{n-1}$ and $a_n$, of the recovered input sequence, are combined with the precomputed partial error signal, $z_n + a_{n-3} + a_{n-2}$, to yield error signal $e_n$. Specifically, FIG. 3C illustrates how $a_{n-1}$ and $a_n$ are used to select the appropriate input of 4-to-1 multiplexer 350, the four inputs representing the values of the error signal, $e_n$, corresponding to each possible permutation of $a_{n-1}$ and $a_n$. A similar arrangement can be used to compute $e_{n-1}$.

The present invention also provides an advantageous method of computing a level signal for use in the feedback loops of the analog front end. In one embodiment, the level signal is a two-bit signal indicating whether the transformed recovered output signal, $x_n$, is positive, negative, or zero. In an exemplary embodiment, the level signal is computed using combinational logic. The combinational logic can be derived by preparing a truth table, such as that shown in FIG. 4, comprising all of the possible output sequences of the Viterbi detector, and the corresponding level of each $x_n$. Implementing the level signal in this manner advantageously enables $level_n$ to be calculated without first having to compute $x_n$. An appropriate circuit can be derived from the truth table using well-know circuit synthesis techniques, and any suitable circuit, including without limitation a multiplexer, programmable logic array, ASIC, NAND/NOR gate array, or any other suitable device, may be chosen in accordance with the principles of the present invention.

In another embodiment, the level signal is pre-computed in a manner similar to that used to pre-compute the error signal. Specifically, in this embodiment, the terms of $x_n$ from which the level signal is calculated are precomputed as recovered input signals $a_n$ are received from the Viterbi detector. Thus, when the final output from the Viterbi detector for a given $x_n$ is received, the level signal for $x_n$ can be determined in a less steps than would otherwise be the case. As a result, this embodiment enables the level signal to be calculated quickly and efficiently, such that it is available at about the same time as the error signal becomes available, even if the error signal is calculated in the novel fashion described herein. The level signal and the error signal can thus be forwarded together to the appropriate processing circuitry for use in the feedback loops of the analog front end.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A system for determining an error signal from an output of a Viterbi detector comprising:
   an analog-to-digital converter for converting a raw output from a data channel into a raw digitized output;
   a Viterbi detector for determining a recovered data sequence from the raw digitized output;
   an error signal preprocessor operable to compute a partial error signal from a first portion of the recovered data sequence and from the raw digitized output; and
   an error signal processor operable to compute a final error signal from the partial error signal and a second portion of the recovered data sequence.

2. The system of claim 1, wherein the second portion of the recovered data sequence comprises a single term in the recovered data sequence.

3. The system of claim 1, wherein the second portion of the recovered data sequence is operable to select the output of a multiplexer.

4. The system of claim 1, wherein the error signal processor is operable to compute the final error signal from the partial error signal and the second portion of the recovered data sequence in one clock cycle.

5. The system of claim 1, wherein the first portion of the recovered data sequence is determined before the second portion of the recovered data sequence is determined, and wherein the error signal preprocessor is operable to compute the partial error signal before the second portion of the recovered data sequence is determined by the Viterbi detector.

6. The system of claim 1, further comprising:
a level signal preprocessor operable to compute a partial level signal from the first portion of the recovered data sequence; and
a level signal processor operable to compute a final level signal from the partial level signal and the second portion of the recovered data sequence.

7. The system of claim 6, wherein the level signal processor is operable to finish computing the final level signal at substantially the same time as the error signal processor is finished computing the final error signal.

8. The system of claim 1 further comprising:
a level signal processor operable to compute a level signal from the first portion of the recovered data sequence and the second portion of the recovered data sequence.

9. A method of determining one or more signals comprising:
receiving a raw digitized output from a data channel;
receiving a first portion of a recovered data sequence determined from the raw digitized output;
precomputing a partial error signal from the first portion of the recovered data sequence and from the raw digitized output;
receiving a second portion of a recovered data sequence determined from the raw digitized output; and
computing a final error signal from the partial error signal and a second portion of the recovered data sequence.

10. A method of determining one or more signals as recited in claim 9, wherein computing a final error signal from the partial error signal and a second portion of the recovered data sequence includes selecting an output of a multiplexer using the second portion of the recovered data sequence.

11. A method of determining one or more signals as recited in claim 9, wherein a Viterbi detector is operable to determine the recovered data sequence from the raw digitized output.

12. A method of determining one or more signals as recited in claim 9, further comprising:
precomputing a partial level signal from a first portion of the recovered data sequence;
computing a final level signal from the partial level signal and a second portion of the recovered data sequence.

13. A method of determining one or more signals as recited in claim 12, wherein computing a final level signal concludes at substantially the same time as the final error signal concludes.

14. A method of determining one or more signals as recited in claim 9, further comprising:
a level signal processor operable to compute a level signal from the first portion of the recovered data sequence and the second portion of the recovered data sequence.

15. A method of determining one or more signals as recited in claim 14, wherein the level signal processor is operable to compute the level signal within one clock cycle after receiving the second portion of the recovered data sequence.

16. A method of determining a level signal, comprising:
receiving a recovered data sequence determined from the raw digitized output by a Viterbi detector;
precomputing a partial level signal from a first portion of the recovered data sequence and from the raw digitized output; and
computing a final level signal from the partial level signal and a second portion of the recovered data sequence.

* * * * *